(12) United States Patent
Lee

(10) Patent No.: US 7,765,950 B2
(45) Date of Patent: Aug. 3, 2010

(54) SPIN CHUCK SENSING APPARATUS FOR SPIN COATING UNIT

(75) Inventor: Do-Gyun Lee, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 732 days.

(21) Appl. No.: 11/687,117

(22) Filed: Mar. 16, 2007

(65) Prior Publication Data

US 2007/0266935 A1  Nov. 22, 2007

(30) Foreign Application Priority Data

May 22, 2006  (KR) ...................... 10-2006-0045473

(51) Int. Cl.
*B05C 13/02* (2006.01)
*B05C 11/00* (2006.01)
*B05C 11/02* (2006.01)

(52) U.S. Cl. .......................... 118/500; 118/712; 118/52; 118/612; 118/319; 118/320; 118/663

(58) Field of Classification Search ................. 118/500, 118/503, 712, 713, 52, 612, 319, 320, 663, 118/687; 134/153, 902; 427/240, 8–9; 451/5.8, 451/285; 279/51, 4.08; 464/162; 369/604, 369/611, 627; 269/21; 294/64.1
See application file for complete search history.

(56) References Cited

U.S. PATENT DOCUMENTS

| | | | | |
|---|---|---|---|---|
| 5,564,682 A | * | 10/1996 | Tsuji | 269/21 |
| 5,923,915 A | * | 7/1999 | Akimoto et al. | 396/604 |
| 6,213,478 B1 | * | 4/2001 | Nishikawa | 279/4.08 |
| 6,632,283 B1 | * | 10/2003 | Singh et al. | 118/713 |

* cited by examiner

*Primary Examiner*—Yewebdar T Tadesse
(74) *Attorney, Agent, or Firm*—F. Chau & Associates, LLC

(57) ABSTRACT

An apparatus for sensing a spin chuck for a spin coating unit includes a spin chuck which sucks a wafer with vacuum pressure to allow the wafer to be placed thereon, a rotary shaft which is rotated by driving of a motor below the spin chuck correspondingly thereto, and whose upper end is engaged with the spin chuck so as to interlock with the rotation of the spin chuck and a shaft guide shaped so as to surround a tubular stationary shaft of the spin chuck engaged with the rotary shaft. The apparatus further includes a sensing unit which senses whether or not the stationary shaft of the spin chuck is inserted into the shaft guide to a predetermined height a control unit which determines whether or not the spin chuck has been assembled normally from a signal sensed by the sensing unit and a notifying means which is controlled by the control unit to allow a user to recognize an assembled state of the spin chuck.

19 Claims, 8 Drawing Sheets

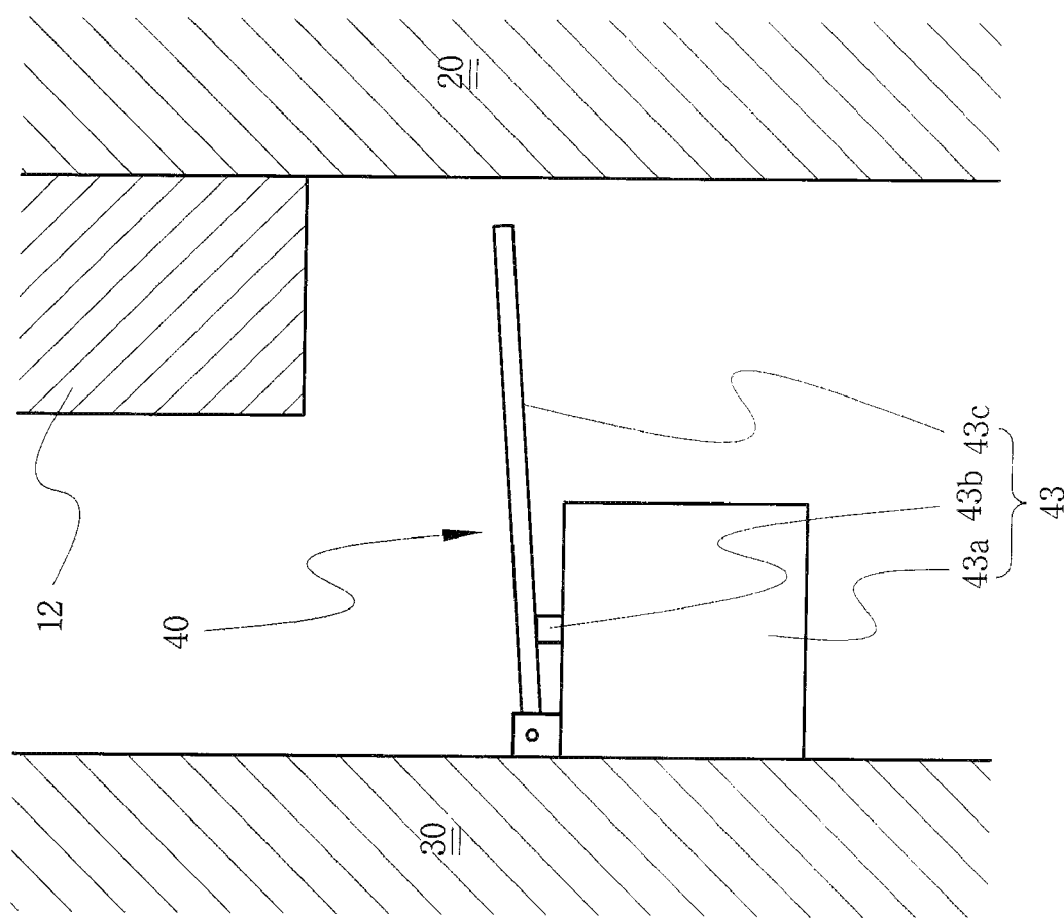

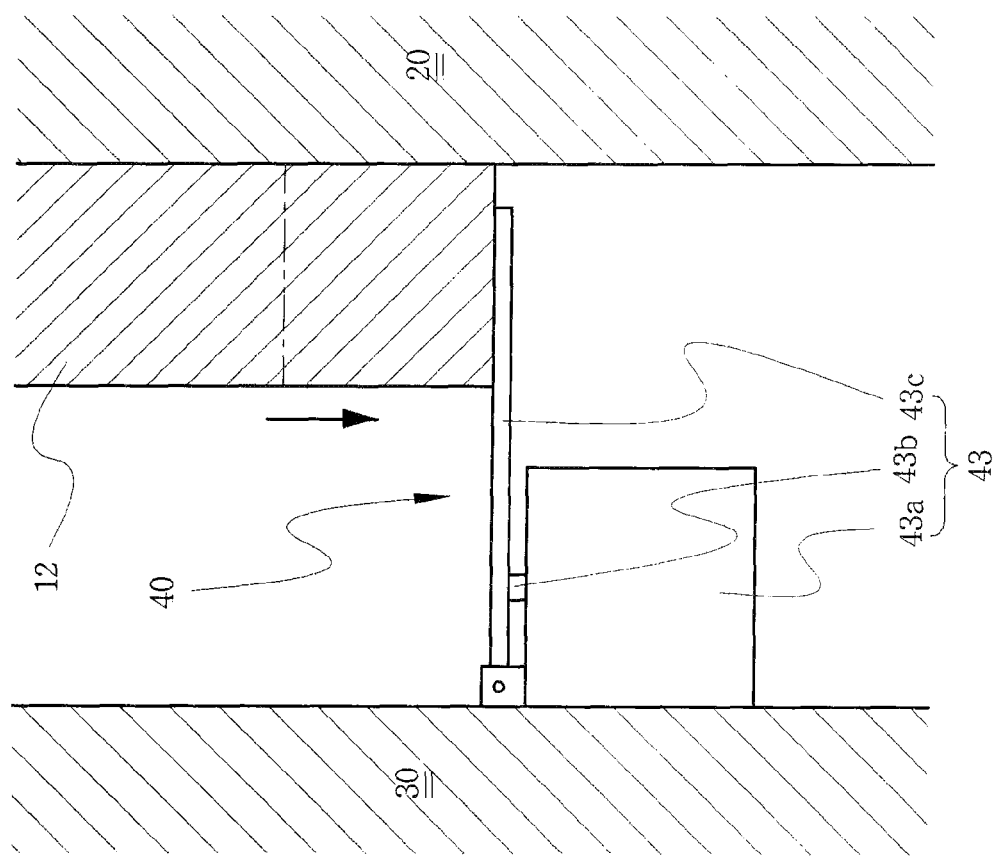

SPIN CHUCK SENSING APPARATUS FOR SPIN COATING UNIT

CROSS-REFERENCE TO RELATED APPLICATION

This application claims the benefit of Korean Patent Application No. 10-2006-0045473, filed May 22, 2006, the disclosure of which is hereby incorporated by reference herein in its entirety.

BACKGROUND OF THE INVENTION

1. Technical Field

The present disclosure relates to an apparatus for sensing a spin chuck for a spin coating unit, and more specifically, to an apparatus for sensing a spin chuck for a spin coating unit which enables an operator to directly confirm whether or not a spin chuck has been assembled normally in the course of assembling.

2. Discussion of Related Art

Generally, the fabrication of a semiconductor device includes the forming of a semiconductor circuit on a wafer. For example, the forming of the semiconductor circuit is performed using growth and deposition of a thin film, coating of a photoresist, etching, implanting, and the like by means of a photo-stepper, an implanter and the like. The procedure is then repeated to form desired circuits.

In the procedure for fabricating a semiconductor device, the process equipment for performing a series of processes including a coating process for coating the photoresist and a developing process for developing the coated photoresist is generally referred to as a spinner or spinner equipment.

The spinner equipment is composed of an adhesion unit for a pretreatment process a spin coating unit which coats photoresist on a wafer at a predetermined thickness with a centrifugal force a baking unit which cures the coated photoresist, a cooling unit which cools down the baked wafer, a stepper which exposes the wafer coated with the photoresist to light, and a developing unit which develops the exposed wafer.

The spin coating unit of the spinner equipment rotates a wafer and discharges a photoresist onto the top face of the rotating wafer to uniformly coat the wafer with the photoresist which is spread onto the surface of the wafer with a centrifugal force.

This spin coating unit is provided with a spin chuck to firmly fix a wafer, and a wafer is sucked and firmly fixed to the spin chuck by vacuum pressure.

Moreover, the spin chuck is designed to be rotatable at constant speed and is covered with an outer case called a bowl so that, during spin coating, the surplus photoresist which remains after being coated on a wafer placed on the spin chuck may be collected into the bottom of the bowl and then drained to the outside. In this spin coating unit, a wafer is loaded/unloaded by elevation of the spin chuck or the bowl.

Further, a wafer is transferred by a transfer robot provided outside the bowl.

In addition, the spin coating unit is adapted to regularly or irregularly perform a checkup and a cleaning of the equipment. In this case, some constituent parts of the equipment are disassembled, cleaned and reassembled.

Among the constituent parts of the equipment which are disassembled as such, the spin chuck is separated from a shaft guide, cleaned, and reassembled.

In this case, the spin chuck is configured such that a chuck plate that is a flat plate on which a wafer is to be placed and a tubular stationary shaft having a predetermined height and provided on the bottom center of the chuck plate are integrally provided.

Accordingly, the spin chuck is tightly fitted to a rotary shaft provided within the shaft guide while the stationary shaft of the spin chuck is inserted into the shaft guide having a larger inner diameter than the outer diameter of the stationary shaft.

Meanwhile, the spin chuck can be manipulated by a user, for example, an engineer from the rotary shaft.

For example, the spin chuck is manually separated from the rotary shaft for checkup and cleaning of the equipment, and manually reassembled when the cleaning is finished.

However, once the spin chuck is separated from the rotary shaft and then reassembled thereto the spin chuck may not always be assembled to the rotary shaft normally due to, for example, an engineer's mistake.

If the spin chuck is not assembled exactly or precisely as such, a wafer which generally is loaded/unloaded from one side of the spin chuck may cause difficulties in that it may collide against the spin chuck while being transferred by a blade of a transfer robot As the vertically spaced clearance between the spin chuck and the blade of the transfer robot or a wafer to be transferred by the blade is extremely low, the wafer may be broken due to collision of the blade or wafer against the spin chuck during loading/unloading of the wafer if the spin chuck is not normally assembled to the rotary shaft or a process error may occur which may cause the breakage of parts.

In particular, as the occurrence of such a process error may cause the operational stoppage of the equipment, the productivity of equipment may also thereby be decreased.

SUMMARY OF THE INVENTION

Exemplary embodiments of the present invention provide an apparatus for sensing a spin chuck for a spin coating unit, which makes it possible for a user, for example, an engineer to check exact assembling of a spin chuck.

Exemplary embodiments of the present invention provide an apparatus for sensing a spin chuck for a spin coating unit capable of preventing the occurrence of a process error resulting from a collision between the spin chuck and a wafer or a blade of a wafer transfer robot in the process of loading a wafer during the performance of processes.

Exemplary embodiments of the present invention provide an apparatus for sensing a spin chuck for a spin coating unit capable of prevent the stoppage of a process during performance of processes.

In accordance with an exemplary embodiment of the present invention, an apparatus for sensing a spin chuck for a spin coating unit is provided. The apparatus includes a spin chuck which sucks a wafer with vacuum pressure to allow the wafer to be placed thereon, a rotary shaft which is rotated by driving of a motor below the spin chuck correspondingly thereto, and whose upper end is engaged with the spin chuck so as to interlock with the rotation of the spin chuck and a shaft guide shaped to surround a tubular stationary shaft of the spin chuck engaged with the rotary shaft. The apparatus further includes a sensing unit which senses whether or not the stationary shaft of the spin chuck is inserted into the shaft guide to a predetermined height, a control unit which determines whether or not the spin chuck has been assembled normally from a signal sensed by the sensing unit and a notifying means which is controlled by the control unit to allow a user to recognize an assembled state of the spin chuck.

In accordance with another exemplary embodiment of the present invention, an apparatus for sensing a spin chuck for a spin coating unit is provided. The apparatus includes a spin chuck which sucks a wafer with vacuum pressure to allow the wafer to be placed thereon, a rotary shaft which is rotated by driving of a motor below the spin chuck correspondingly thereto, and whose upper end is engaged with the spin chuck so as to interlock with the rotation of the spin chuck and a shaft guide shaped to surround a tubular stationary shaft of the spin chuck engaged with the rotary shaft. The apparatus further includes a sensing unit which senses whether or not the stationary shaft of the spin chuck is inserted into the shaft guide to a predetermined height and a control unit which continues or stops driving of the motor according to a sensing signal from the sensing unit.

BRIEF DESCRIPTION OF THE DRAWINGS

Exemplary embodiments of the present invention can be understood in more detail from the following detailed description taken in conjunction with the accompanying drawings, in which:

FIG. 7 is an enlarged view illustrating an example of a sensing unit in the spin chuck sensing apparatus according to an exemplary embodiment of the invention; and FIG. 8 is an enlarged view illustrating the moment when the spin chuck is combined to a normal height by the sensing unit of FIG. 7.

DETAILED DESCRIPTION OF THE EXEMPLARY EMBODIMENTS OF THE INVENTION

Hereinafter, exemplary embodiments of the present invention will be described in more detail with reference to the accompanying drawings.

In equipment for manufacturing a semiconductor device, a spinner is equipment for forming an etched pattern through a series of processes, such as, for example, coating photoresist (photosensitive solution) on a wafer, exposing the coated photoresist, and then developing the exposed photoresist.

In the spinner, for example, the means which is adapted to coat photoresist is referred to as a spin coater or a spin coating unit. This spin coating unit is generally divided into a bowl which covers the outside, a spin chuck which allows a wafer to be loaded inside the bowl to be placed thereon, and a chuck driving unit which rotates the spin chuck at constant speed.

The bowl is formed so as to surround the outside of the spin coating unit, and its top is open and its bottom is formed with a drain line.

The spin chuck is provided in the inner center of the bowl, and the spin chuck is provided so as to be rotatable at constant speed by the spin chuck driving unit below the spin chuck.

For example, the spin chuck is provided in the inner center of the bowl, and a rotary shaft of the chuck driving unit is connected to a lower part of the spin chuck through the bottom of the bowl so that the spin chuck can be rotated by the chuck driving unit.

In this case, an upper part of the bowl is provided with nozzles for supplying photoresist to be coated on a wafer placed on the spin chuck. These nozzles generally are provided so as to be rotatable horizontally and are located above the spin chuck during performance of a process, but located outside the bowl before and after the performance of the process.

In this configuration, a wafer is loaded/unloaded on/from the spin chuck by elevation of the bowl or the spin chuck.

Meanwhile, in the spin coating unit, the spin chuck is driven by a separate chuck-driving means. A main driving means in this chuck driving means is a motor.

Figure 1:
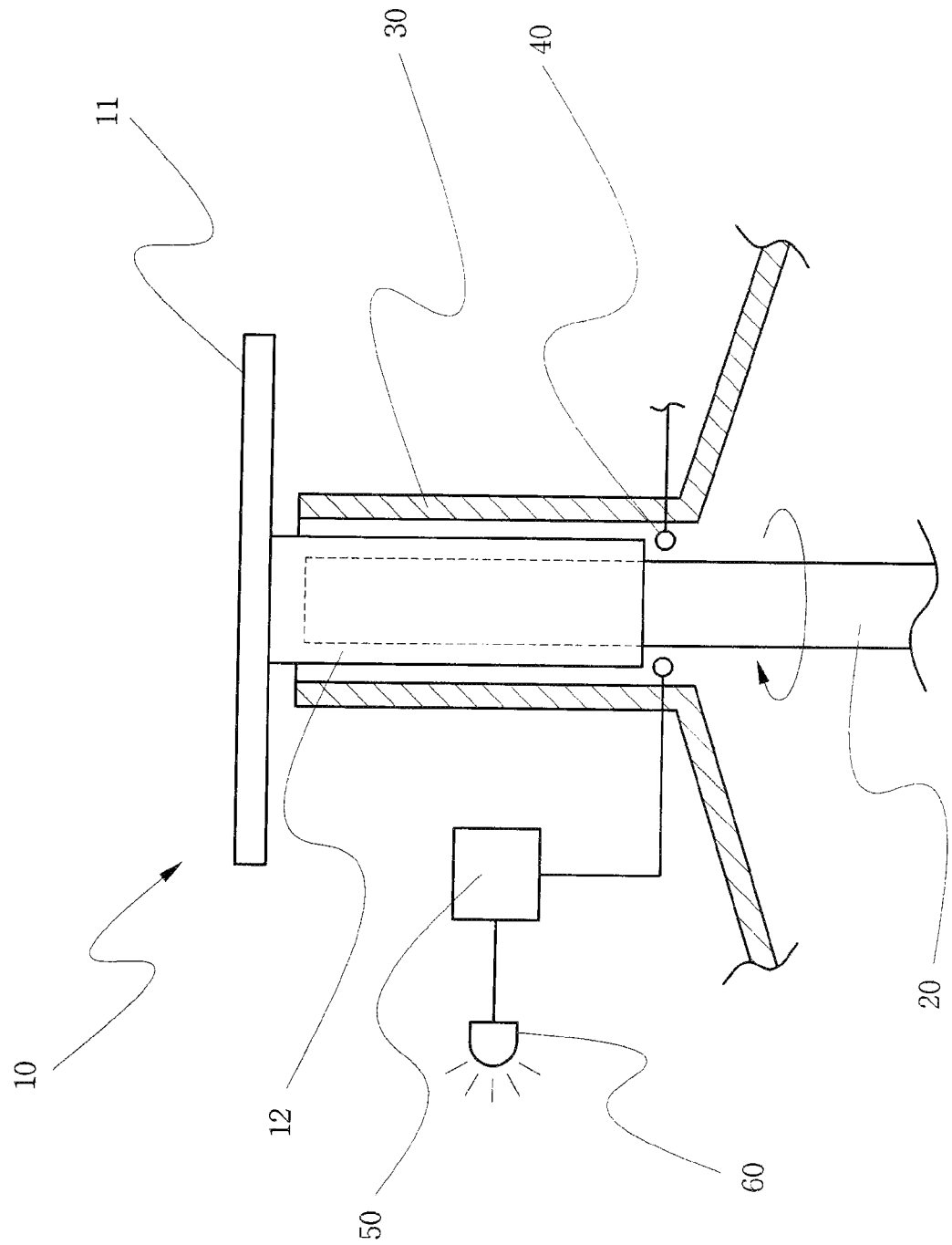
FIG. 1 is a side sectional view showing a spin chuck sensing apparatus according to an exemplary embodiment of the invention.
Figure 2:
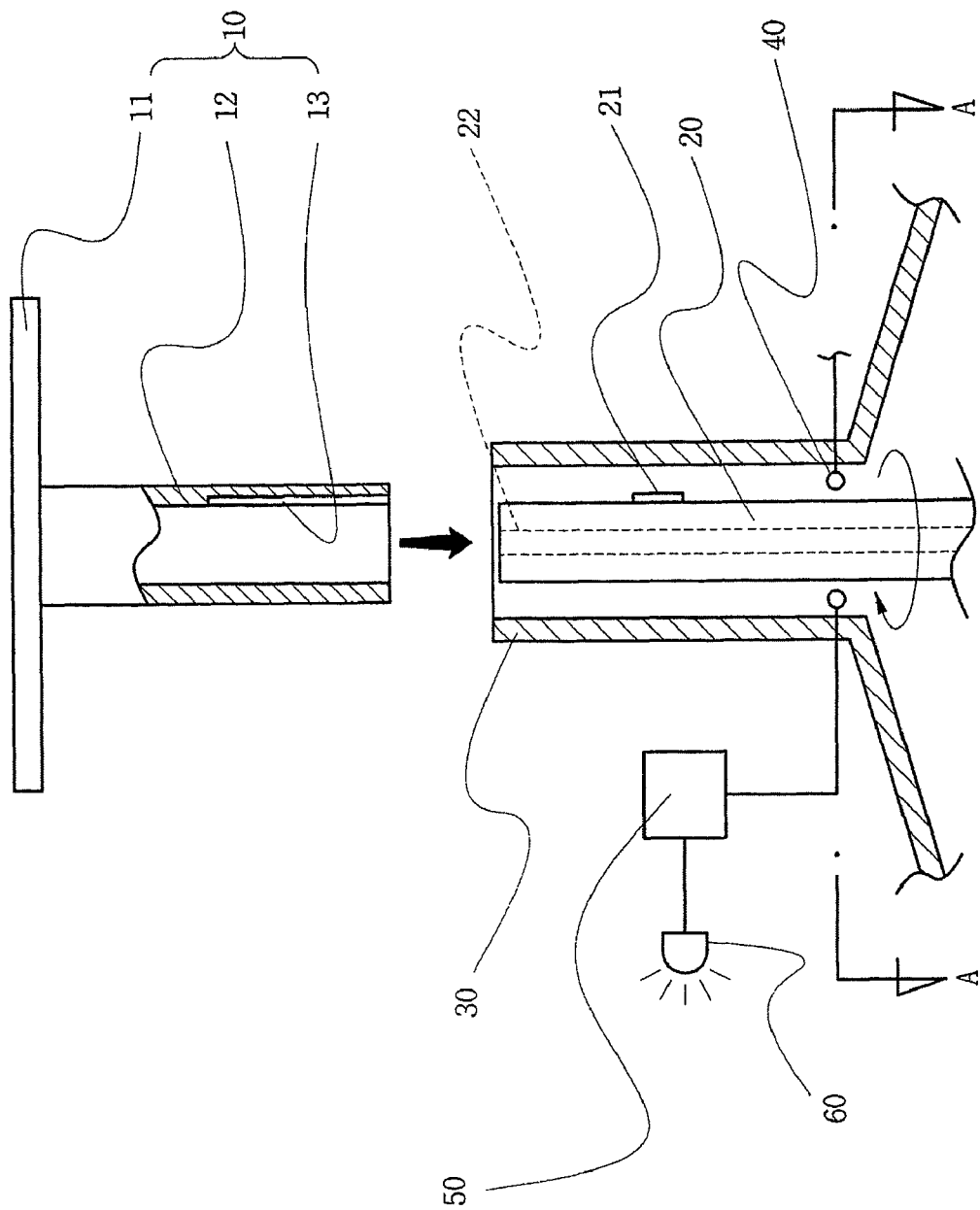
FIG. 2 is a side sectional view showing that a spin chuck is separated from the spin chuck sensing apparatus according to an exemplary embodiment of the invention.
Figure 3:
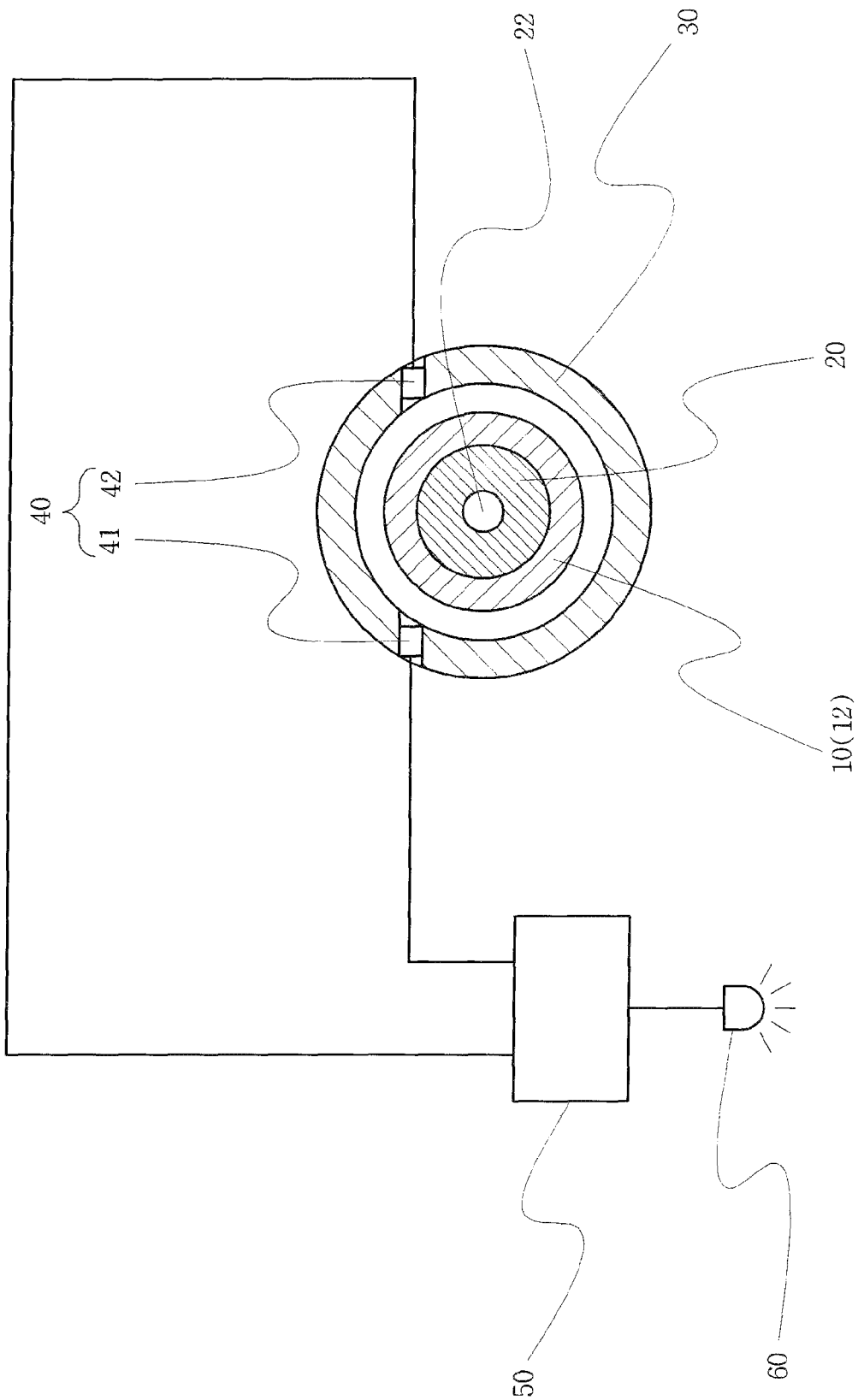
FIG. 3 is a sectional view taken along line A-A of an exemplary embodiment of the present invention depicted in FIG. 2.

FIG. 1 is a side sectional view showing a spin chuck sensing apparatus according to an exemplary embodiment of the invention. FIG. 2 is a side sectional view illustrating that a spin chuck is separated from the spin chuck sensing apparatus according to an exemplary embodiment of the invention, and FIG. 3 is a sectional view taken along line A-A of an exemplary embodiment of the present invention depicted in FIG. 2.

As shown in these figures, the spin chuck sensing apparatus according to an exemplary embodiment of the invention comprises a spin chuck 10, a rotary shaft 20, a shaft guide 30, a sensing unit 40, and a control unit 50.

For example, the spin chuck 10, as shown in the figures, is provided with a flat chuck plate 11 with a predetermined diameter, which allows a wafer to be placed on the top face thereof, and the bottom central face of the chuck plate 11 is integrally formed with a tubular stationary shaft 12 with a predetermined height.

The chuck plate 11 is formed with a number of vacuum holes which allows a wafer placed on the top face of the chuck plate 11 to be sucked by vacuum pressure, and the stationary shaft 12 is formed with a fitting groove 13 which is recessed radially outwardly with a predetermined width to a predetermined height from a lower end thereof at an inner peripheral face thereof.

In addition, the bottom face of the chuck plate 11 within the stationary shaft 12 is formed with a line coupler which couples one end of a vacuum line which enables vacuum pressure to be generated.

The rotary shaft 20 is connected to a motor at a lower end thereof to transmit the torque from the motor to the spin chuck 10.

Accordingly, an upper end of the rotary shaft 20 is inserted to a predetermined height from a lower end of the stationary shaft 12 of the chuck plate 11 such that it is combined with the stationary shaft by force fitting.

In this case, the outer peripheral face of the rotary shaft 20 is formed with a hooking projection 21 at a predetermined height from the upper end of the rotary shaft, and this hooking projection 21 is sized such that it can be accommodated into the fitting groove 13 of the stationary shaft 12.

Meanwhile, the spin chuck 10 is tightly combined with the rotary shaft 20 by forming the rotary shaft 20 such that the tolerance between the outer diameter of the rotary shaft and the inner diameter of the stationary shaft 12 is approximately zero.

For example, the interior of the rotary shaft 20 is provided with a vacuum line 22 which extends along the rotary shaft 20 from the motor.

The vacuum line 22 of the rotary shaft 20 communicates with the upper end of the rotary shaft 20. Accordingly, the upper end of the rotary shaft 20 is tightly coupled with the line coupler formed at the bottom of the chuck plate 11 during assembly of the spin chuck 10 so that vacuum pressure may be transmitted to the spin chuck 10.

The shaft guide 30 is provided so as to surround the tubular stationary shaft 12 of the spin chuck 10 which is combined with the rotary shaft 20.

For example, the shaft guide is formed in the shape of a tube from its lower end which is firmly fixed to equipment so that the rotary shaft 20 may vertically pass through an inner diameter part of such a tube from the bottom.

Accordingly, the shaft guide 30 is a fixed structure which does not move even during loading/unloading of a wafer.

The sensing unit 40 senses whether or not the stationary shaft 12 of the spin chuck 10 has been inserted into the shaft guide 30 to a predetermined height.

Accordingly, it is preferable that the sensing unit 40 be provided in the shaft guide 30 that is a fixed part.

Further, it is preferable that a photo diode or a laser diode consisting of a light-emitting element and a light-receiving element be used as the sensing unit 40. In this case, it is preferable that the light-emitting element 41 and the light-receiving element 42, as shown in FIG. 3, be installed in the portions of the shaft guide 30 which face each other in a straight line at an elevated position of the stationary shaft 12 which deviates from one side of the outer peripheral face of the rotary shaft 20.

For example, the installation height of the sensing unit 40 is a position where the stationary shaft 12 can be sensed by the sensing unit 40 when the lower end of the stationary shaft 12 is located at the lowermost position while the stationary shaft 12 is exactly assembled onto the rotary shaft 20.

The control unit 50 checks the signal sensed by the sensing unit 40, and then informs an operator of whether or not the spin chuck 10 has been assembled normally according to the checked signal.

In this case, as for the control unit 50, it is preferable that a separate program be installed in a controller which controls the operation of the equipment and this program be run simultaneously with control of the equipment in cooperation therewith.

A notifying means 60 is provided to allow an engineer to readily recognize whether or not the spin chuck 10 has been assembled normally according to a sensed signal which is checked by the control unit 50.

The notifying means 60 may include various display means, such as, for example, a buzzer, a lamp, and a display, and preferably a means that allows an engineer to readily recognize whether or not the spin chuck has been assembled normally, at an immediately checkable position while the engineer assembles the spin chuck 10.

Hereinafter, the operation of the exemplary embodiments of the present invention configured as described above will now be described in more detail.

As the state where the spin chuck 10 is assembled should always be kept exact during performance of a process by a spin coating unit, the assembled state should always be displayed normally while the spin chuck 10 is sensed by the sensing unit 40.

If, however, the abnormally assembled state of the spin chuck 10 is displayed during performance of the process, the operation of the equipment should be stopped immediately to assemble the spin chuck 10 exactly.

As mentioned above, the equipment is checked up regularly or irregularly. At this time, the spin chuck 10 will also be separated from the equipment, for example, the rotary shaft 20.

If the spin chuck 10 is separated, the stationary shaft 12 of the spin chuck 10 will no longer be sensed by the sensing unit 40. Therefore, as the control part 50 outputs a signal indicative of poor assembling, an engineer can immediately confirm such a state visibly from the notifying means 60.

This confirmation work serves as a decisive factor in determining whether or not the sensing unit 40 and the control unit 50 operate normally.

Meanwhile, the disassembled spin chuck 10, the shaft guide 30, and the rotary shaft 20 pivotally supported by the shaft guide 30, together with other constituent parts of the equipment are chucked and cleaned.

When the checking and cleaning of the equipment including a shaft drive is completed, the exploded or separated constituent parts of the equipment are assembled one by one by an engineer.

Figure 4:
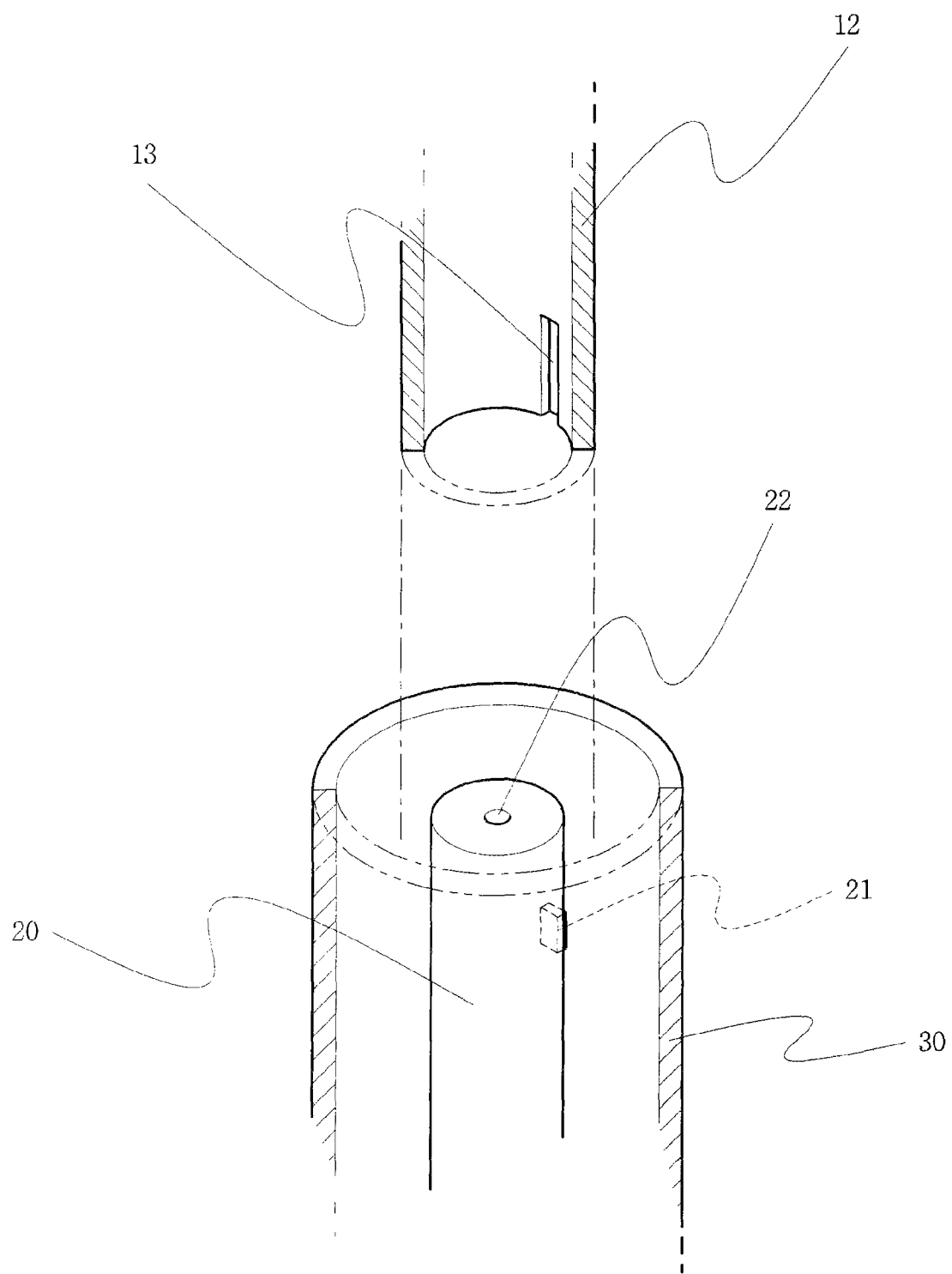
FIG. 4 is an exploded perspective view illustrating that the spin chuck and the stationary shaft are combined together in the spin chuck sensing apparatus according to an exemplary embodiment of the invention.

FIG. 4 is an exploded perspective view illustrating that the spin chuck and the stationary shaft are combined together in the spin chuck sensing apparatus according to an exemplary embodiment of the invention.

As shown in this figure, the spin chuck 10 is closely fitted on the rotary shaft 20, which is already installed within the shaft guide 30, while the stationary shaft 12 is inserted into the shaft guide 30.

In this case, as the fitting groove 13 is formed with a predetermined height vertically on a portion of the inner peripheral face of the stationary shaft 12, the spin chuck 10 is combined by slidingly inserting the fitting projection 21 into the fitting groove 13 such that the fitting groove 13 is located on the same vertical line with the fitting projection 21 provided to project from a portion of the rotary shaft 20.

Figure 5:
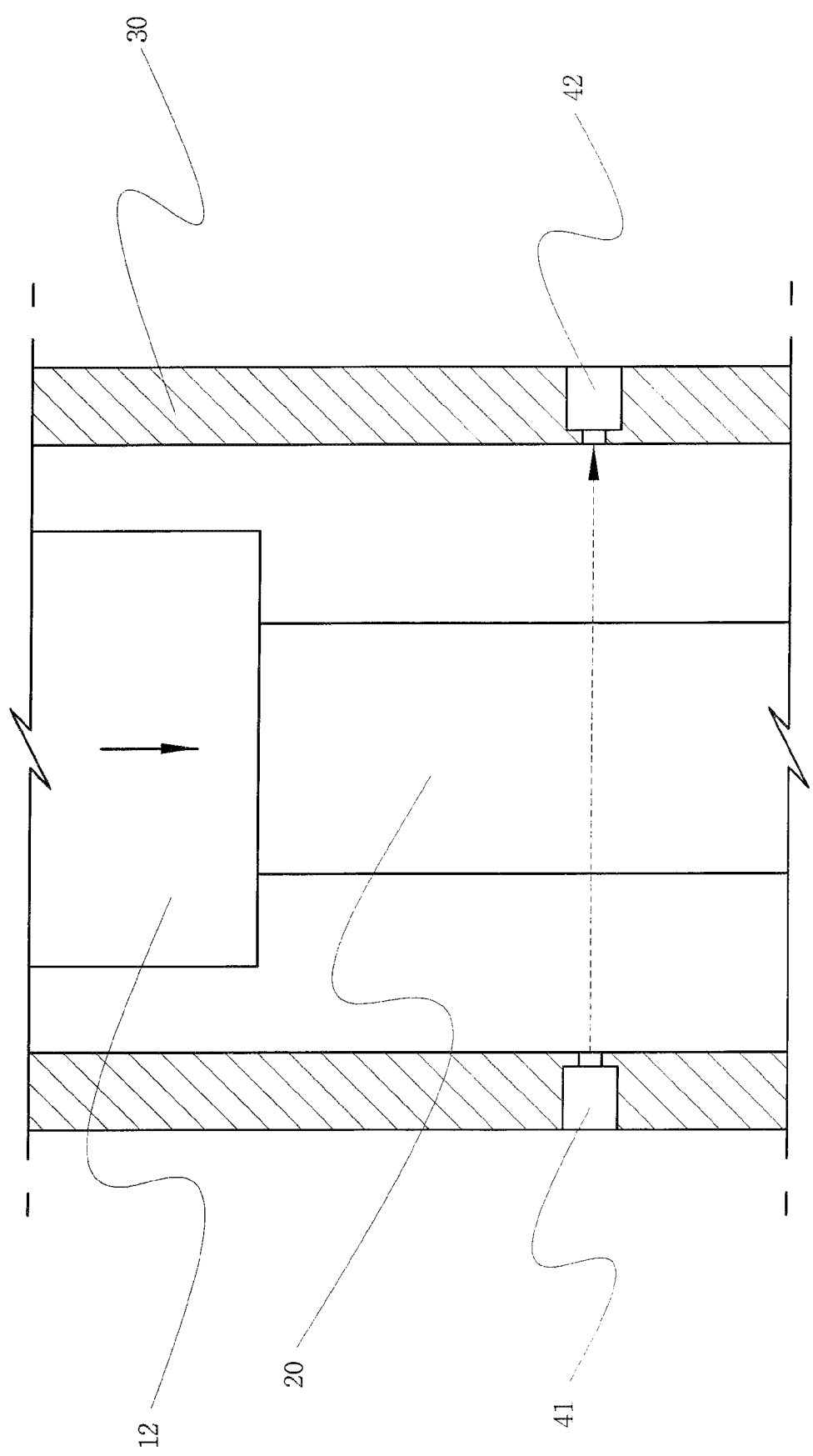
FIG. 5 is an enlarged sectional view illustrating a process of assembling the spin chuck to the spin chuck sensing apparatus according to an exemplary embodiment of the present invention.
Figure 6:
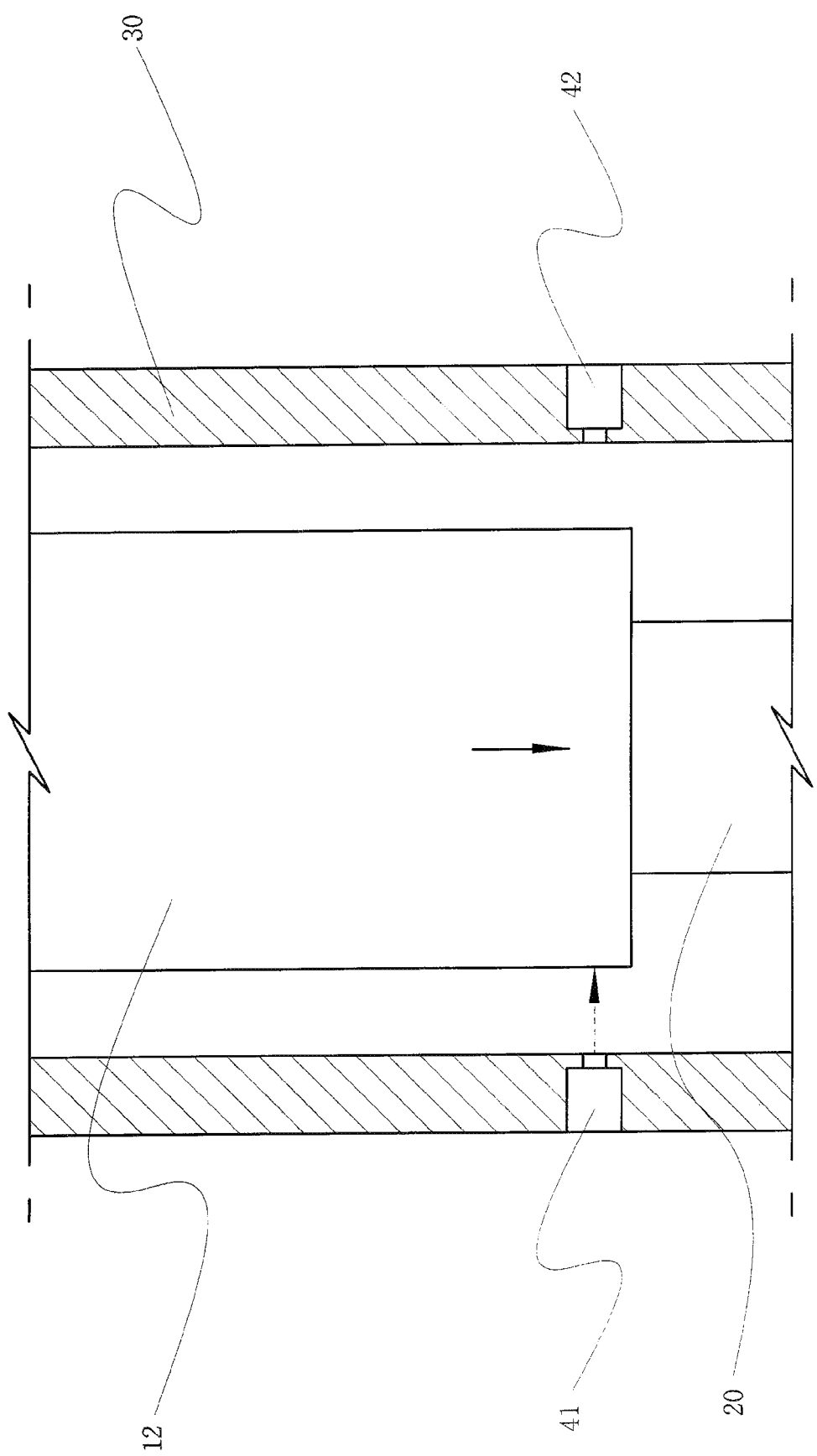
FIG. 6 is an enlarged sectional view illustrating that the spin chuck has been assembled to the spin chuck sensing apparatus according to an exemplary embodiment of the invention.

FIGS. 5 and 6 illustrate an operational state in the process of assembling the spin chuck to the spin chuck sensing apparatus according to an exemplary embodiment of the invention.

As shown in these figures, when the spin chuck is tightly fitted to the rotary shaft 20 so as to reach a set height of the rotary shaft, the lower end of the stationary shaft 12 of the descending spin chuck 10 will reach a position where the sensing unit 40 is mounted.

If the stationary shaft 12 of the spin chuck 10 is sensed by the sensing unit 40, the control unit 50 determines that the assembling state is normal and displays this or notifies an engineer of this through the notifying means 60 so that the engineer can readily recognize it.

FIGS. 7 and 8 are enlarged views of essential parts illustrating another example of the sensing unit in the spin chuck sensing apparatus according to an exemplary embodiment of the invention. In particular, FIG. 7 illustrates that the spin chuck does not reach a normal height and FIG. 8 illustrates the moment when the stationary shaft of the spin chuck is sensed by the sensing unit when the spin chuck is combined to a normal height.

As shown in these figures, the sensing unit 40 in the spin chuck sensing apparatus may be, for example, of a switching type.

For example, the sensing unit is configured such that a switch 43 is provided on a portion of the inner peripheral face of the shaft guide 30, a main body 43a of the switch 43 is provided with a knob 43b having upwardly protruding resilience, a plate 43c whose one end is hinged to a portion of the main body 43a comes into contact with an upper end of the knob 43b, and the other end of the plate 43c is located at a position where it can come into contact with the lower end of the stationary shaft 12.

In this cases the knob 43b functions to switch on/off a power source within the main body 43a while it is raised or lowered by the plate 43c.

Accordingly, when the other end of the plate 43c, as shown in FIG. 8 is pushed down by descent of the stationary shaft 12 the knob 43b is simultaneously pushed down by the plate 43c. At this time, if the knob 43b is pushed down over a predetermined height, electrical connection or disconnection will be established within the main body 43a so that the fact that the stationary shaft 12 has been lowered to a maximum and safely assembled can be sensed by the sensing unit 40.

The control unit 50 checks the signal sensed by the sensing unit 40 to determine whether or not the spin chuck 10 has been assembled normally, and then controls the operation of the notifying means 60 according to this determination.

Meanwhile, the sensing unit 40 which is adapted to switch on/off a power source may be configured such that, for example the notifying means 60 is operated directly on the basis of a switching signal sensed by the sensing unit 40.

This configuration allows a user, for example, an engineer who operates the equipment to readily recognize the assembled state of the spin chuck 10.

Then, the engineer can readily recognize whether or not the spin chuck 10 has been assembled normally from a signal to be displayed from the notifying means 60 at that time.

Since the spin chuck 10 has not been assembled exactly yet if a signal indicative of normal assembling is sent from the notifying means 60, the spin chuck 10 is further fitted onto the rotary shaft 20 until the signal indicative of normal assembling is sent out by further applying pressure to the spin chuck 10.

When the spin chuck 10 is fitted exactly, the control unit 50 checks the sensing signal of the sensing unit 40 and displays the result visibly through the notifying means 60. At this time, the assembling work of the spin chuck 10 by the engineer is completed.

As such, the exemplary embodiments of the present invention makes it possible to operate equipment and perform processes normally after the assembled state of the spin chuck is checked through the notifying means 60 and a signal indicative of normal assembling is generated.

Meanwhile, the exemplary embodiments of the present invention also make it possible for an engineer to check the assembling state of the spin chuck 10 according to the driving state of a motor as a driving means of the rotary shaft 20 by allowing the control unit 50 to continue or stop the driving of the rotary shaft directly according to the assembled state of the spin chuck 10 without using the separate notifying means 60.

For example, if the motor is driven normally when the motor is driven for carrying out a process directly after the spin chuck 10 is assembled to the rotary shaft 20, the spin chuck 10 will be in a normally assembled state. On the contrary, if the motor is not driven normally, the spin chuck 10 will be in an abnormally assembled state. Accordingly, the spin chuck 10 is more powerfully fitted to the rotary shaft 20 again in a state where driving of the motor is stopped so that the motor can be driven only in a state where the spin chuck 10 is assembled exactly.

Accordingly, if only the spin chuck 10 is normally fitted to the rotary shaft 20 until a normal signal through the notifying means 60 is displayed or the motor is driven normally, the operation of equipment can consistently be carried out safely.

When the spin chuck 10 is safely assembled as such, processes can be continuously and safely carried out and the collision of the spin chuck 10 against a blade of a wafer transfer robot or a wafer can also be prevented during loading/unloading of a wafer by the spin chuck 10.

Normal assembling of the spin chuck 10 may prevent damage to the spin chuck 10, a blade and a wafer, and may also allow an engineer to consistently be able to perform exact or precise assembling work irrespective of the degree of skill for the work.

Further, as exemplary embodiments of the present invention may prevent process errors which may occur during performance of processes and also prevent the time delay from the operational stoppage of the equipment resulting therefrom, the exemplary embodiments of the present invention may thereby improve the operational rate and productivity of the equipment.

As described above, the exemplary embodiments of the present invention make it possible for a user e.g., an engineer to confirm whether the spin chuck has been assembled normally in the process of assembling parts immediately after checkup or a cleaning of the equipment.

Further, as the exemplary embodiments of the present invention allow processes to be performed consistently in a state where the spin chuck is assembled exactly, damage to a wafer or damage to a blade of a wafer transfer robot or a spin chuck can be prevented to provide more economical maintenance of the equipment.

For example, the exemplary embodiments of the present invention provides very beneficial effects in that the operational rate of equipment and the productivity of the equipment can be maximized while minimizing the loss resulting from the delay of the operational time of equipment until the equipment is restarted which occurs when the performance of processes has been stopped due to collision between a spin chuck and a blade or wafer.

Having described the exemplary embodiments of the present invention, it is further noted that it is readily apparent to those of reasonable skill in the art that various modifications may be made without departing from the spirit and scope of the invention which defined by the metes and bounds of the appended claims.

What is claimed is:

1. An apparatus for sensing a spin chuck for a spin coating unit comprising:
  a spin chuck which sucks a wafer with vacuum pressure to allow the wafer to be placed thereon;
  a rotary shaft which is rotated by driving of a motor below the spin chuck correspondingly thereto, and whose upper end is engaged with the spin chuck so as to interlock with the rotation of the spin chuck,
  a shaft guide shaped to surround a tubular stationary shaft of the spin to chuck engaged with the rotary shaft;
  a sensing unit which senses whether or not the tubular stationary shaft of the spin chuck is inserted into the shaft guide to a predetermined height;
  a control unit which determines whether or not the spin chuck has been assembled normally from a signal sensed by the sensing unit; and
  a notifying means which is controlled by the control unit to allow a user to recognize an assembled state of the spin chuck.

2. The apparatus for sensing a spin chuck for a spin coating unit according to claim 1, wherein the tubular stationary shaft from an open lower end of which the rotary shaft is inserted is integrally disposed in a bottom center of the spin chuck.

3. The apparatus for sensing a spin chuck for a spin coating unit according to claim 2, wherein a portion of an inner peripheral face of the tubular stationary shaft of the spin chuck includes a fitting groove which is recessed radially outward with a predetermined depth to a predetermined height from the lower end of the tubular stationary shaft and a portion of an outer peripheral face of the rotary shaft includes a fitting projection which is slidingly inserted into the fitting groove located in the tubular stationary shaft of the spin chuck to allow rotational interlockinig therewith.

4. The apparatus for sensing a spin chuck for a spin coating unit according to claim 3, wherein the sensing unit senses the outer peripheral face of the tubular stationary shaft on the side of the lower end thereof when the tubular stationary shaft of the spin chuck is lowered to a set height of the rotary shaft.

5. The apparatus for sensing a spin chuck for a spin coating unit according to claim 2, wherein an inner diameter portion of the tubular stationary shaft of the spin chuck has tolerance with respect to the rotary shaft so as to tightly circumscribe the rotary shaft.

6. The apparatus for sensing a spin chuck for a spin coating unit according to claim 1, wherein the shaft guide has an inner diameter spaced by a predetermined clearance from the outer diameter of the tubular stationary shaft of the spin chuck inserted thereinto.

7. The apparatus for sensing a spin chuck for a spin coating unit according to claim 1, wherein the sensing unit includes a tight-emitting element and a light-receiving element which are respectively provided in portions of an inner peripheral face of the shaft guide which face each other and deviate from one side of an inner peripheral face of the rotary shaft.

8. The apparatus for sensing a spin chuck for a spin coating unit according to claim 1, wherein the sensing unit comprises a main body fixed to a portion of the inner peripheral face of the shaft guide, a knob which is resiliently supported on the top face of the main body to switch on/off a power source, and a plate which operates the knob as one end of the knob is raised or lowered by the tubular stationary shaft according to the assembled state of the spin chuck.

9. The apparatus for sensing a spin chuck for a spin coating unit according to claim 8, wherein the plate is provided such that one end thereof is pivotally supported in the main body, and the other end thereof is located at a position where it comes into contact with the tubular stationary shaft of the spin chuck.

10. An apparatus for sensing a spin chuck for a spin coating unit comprising:
 a spin chuck which sucks a wafer with vacuum pressure to allow the wafer to be placed thereon;
 a rotary shaft which is rotated by driving of a motor below the spin chuck correspondingly thereto, and whose upper end is engaged with the spin chuck so as to interlock with the rotation of the spin chuck;
 a shaft guide shaped to surround a tubular stationary shaft of the spin chuck engaged with the rotary shaft;
 a sensing unit which senses whether or not the tubular stationary shaft of the spin chuck is inserted into the shaft guide to a predetermined height; and
 a control unit which continues or stops driving of the motor according to a sensing signal from the sensing unit.

11. The apparatus for sensing a spin chuck for a spin coating unit according to claim 10, wherein the tubular stationary shaft from an open lower end of which the rotary shaft is inserted is integrally disposed in a bottom center of the spin chuck.

12. The apparatus for sensing a spin chuck for a spin coating unit according to claim 11, wherein a portion of an inner peripheral face of the tubular stationary shaft of the spin chuck includes a fitting groove which is recessed radially outward with a predetermined depth to a predetermined height from the lower end of the tubular stationary shaft and a portion of an outer peripheral face of the rotary shaft includes a fitting projection which is slidingly inserted into the fitting groove located in the tubular stationary shaft of the spin chuck to allow rotational interlocking therewith.

13. The apparatus for sensing a spin chuck for a spin coating unit according to claim 12, wherein an inner diameter portion of the tubular stationary shaft of the spin chuck has tolerance with respect to the rotary shaft so as to tightly circumscribe the rotary shaft.

14. The apparatus for sensing a spin chuck for a spin coating unit according to claim 12, wherein the sensing unit senses the outer peripheral face of the tubular stationary shaft on the side of the lower end thereof when the tubular stationary shaft of the spin chuck is lowered to a set height of the rotary shaft.

15. The apparatus for sensing a spin chuck for a spin coating unit according to claim 11, wherein the shaft guide has an inner diameter spaced by a predetermined clearance from the outer diameter of the tubular stationary shaft of the spin chuck inserted thereinto.

16. The apparatus for sensing a spin chuck for a spin coating unit according to claim 11, wherein the sensing unit includes a light-emitting element and a light-receiving element which are respectively provided in portions of an inner peripheral face of the shaft guide which face each other and deviate from one side of an inner peripheral face of the rotary shaft.

17. The apparatus for sensing a spin chuck for a spin coating unit according to claim 11, wherein the sensing unit comprises a main body fixed to a portion of the inner peripheral face of the shaft guide, a knob which is resiliently supported on the top face of the main body to switch on/off a power source, and a plate which operates the knob as one end of the knob is raised or lowered by the tubular stationary shaft according to the assembled state of the spin chuck.

18. The apparatus for sensing a spin chuck for a spin coating unit according to claim 17, wherein the plate is provided such that one end thereof is pivotally supported in the main body, and the other end thereof is located at a position where it comes into contact with the tubular stationary shaft of the spin chuck.

19. The apparatus for sensing a spin chuck for a spin coating unit according to claim 11, further-comprising a notifying means which allows a user to recognize whether or not the spin chuck has been assembled normally according to a signal output from the control unit.

* * * * *